(12) United States Patent
Rimstad et al.

(10) Patent No.: US 6,744,825 B1
(45) Date of Patent: Jun. 1, 2004

(54) METHOD AND SYSTEM FOR QUADRATURE MODULATION AND DIGITAL-TO-ANALOG CONVERSION

(75) Inventors: Knut Rimstad, Tonsberg (NO); Alv Aarskog, Asker (NO)

(73) Assignee: Nera ASA, Billingstad (NO)

( * ) Notice: Subject to any disclaimer, the term of this patent is extended or adjusted under 35 U.S.C. 154(b) by 0 days.

(21) Appl. No.: 09/297,276

(22) PCT Filed: Nov. 5, 1997

(86) PCT No.: PCT/NO97/00291

§ 371 (c)(1),
(2), (4) Date: Jun. 21, 1999

(87) PCT Pub. No.: WO98/20657

PCT Pub. Date: May 14, 1998

(30) Foreign Application Priority Data

Nov. 7, 1996 (NO) .................................................. 964715

(51) Int. Cl.[7] .............................................. H04L 27/00
(52) U.S. Cl. .................. 375/298; 375/225; 375/240.03; 375/243; 375/316
(58) Field of Search ................................ 375/298, 225, 375/240.03, 242, 243, 316

(56) References Cited

U.S. PATENT DOCUMENTS

| 4,626,803 | A | | 12/1986 | Holm |
| 5,200,750 | A | | 4/1993 | Fushiki et al. |
| 5,410,750 | A | * | 4/1995 | Cantwell et al. ............. 375/148 |
| 5,512,865 | A | | 4/1996 | Fague |
| 5,530,722 | A | | 6/1996 | Dent |
| 5,588,025 | A | * | 12/1996 | Strolle et al. ................ 375/316 |
| 5,621,345 | A | | 4/1997 | Lee et al. |
| 5,701,106 | A | * | 12/1997 | Pikkarainen et al. ......... 332/100 |
| 5,923,712 | A | * | 7/1999 | Leyendecker et al. ....... 375/297 |
| 6,230,255 | B1 | * | 5/2001 | Asghar et al. ................. 700/2 |
| 6,317,468 | B1 | * | 11/2001 | Meyer ......................... 375/269 |

FOREIGN PATENT DOCUMENTS

| GB | 2 233 518 | 1/1991 |
| WO | 96/31944 | 10/1996 |

* cited by examiner

*Primary Examiner*—Emmanual Boyd
*Assistant Examiner*—Pankaj Kumar
(74) *Attorney, Agent, or Firm*—Young & Thompson

(57) ABSTRACT

A method and system for quadrature modulation and digital-to-analog conversion of a sampled and digitally represented complex baseband signal which permits the use of simple, power-saving, accurate and effective digital signal processing up to a very high intermediate frequency. The invention requires an input signal in the form of an oversampled complex baseband signal. The inphase (I) and quadrature-phase (Q) components of this signal are first quantized to preferably 1 bit per sample, e.g., with the aid of $\Sigma\Delta$ modulation, so that the quantization noise is essentially forced outside the frequency band of the working signal. Then the sampling rate of the quantized versions of I and Q is converted to four times the desired carrier frequency, before the signal is quadrature modulated with a signal frequency exactly equal to one quarter of the final sampling rate. Finally the ready processed digital signal is converted to an analog quadrature modulated signal through a digital-to-analog converter followed by a bandpass filter.

17 Claims, 3 Drawing Sheets

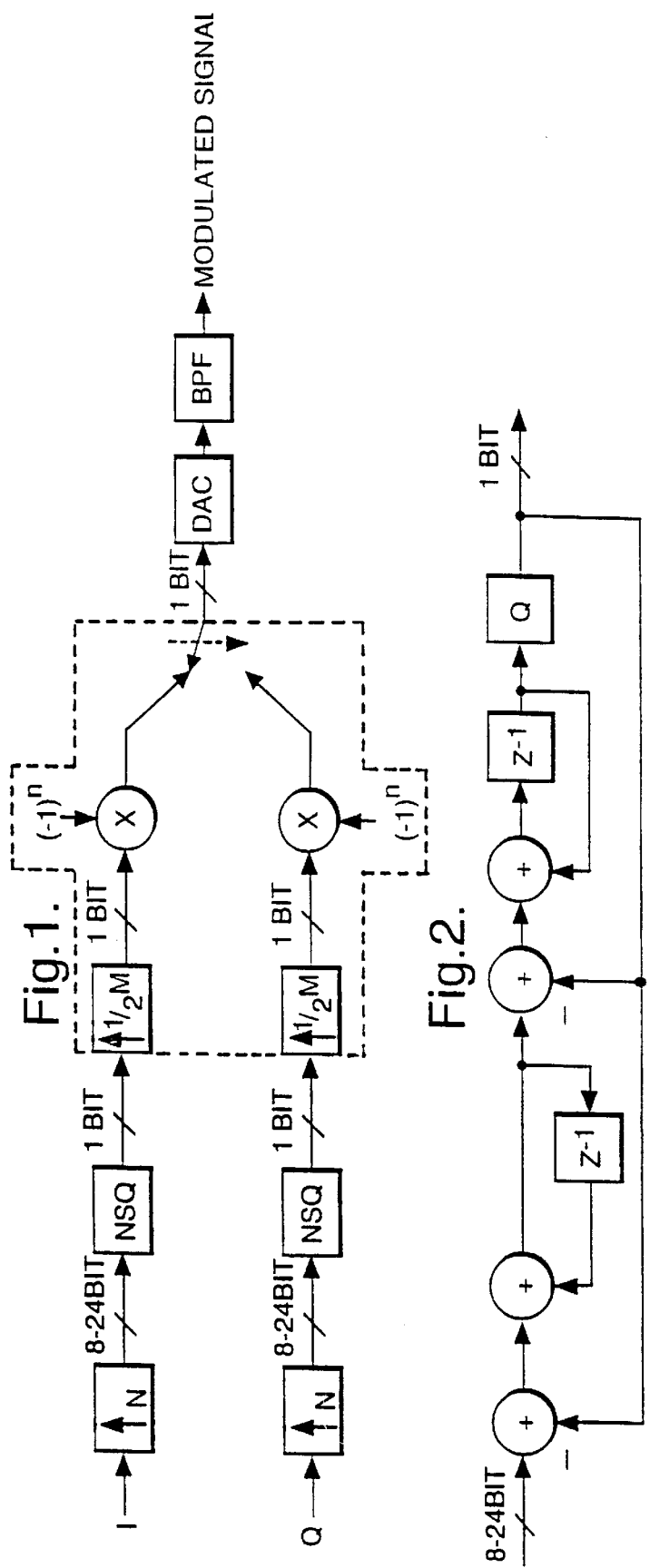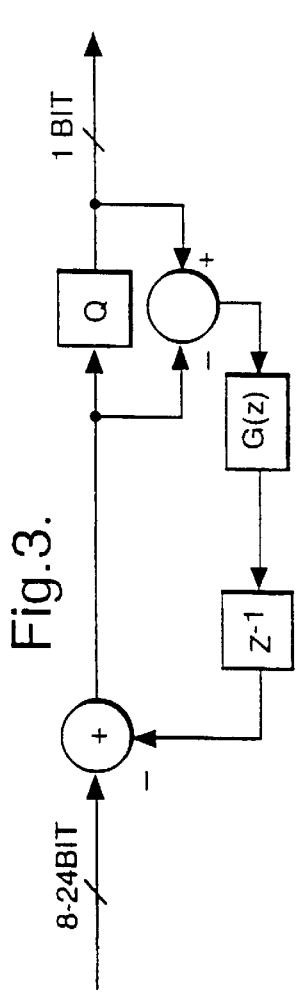

METHOD AND SYSTEM FOR QUADRATURE MODULATION AND DIGITAL-TO-ANALOG CONVERSION

BACKGROUND OF THE INVENTION

The present invention relates to a method for quadrature modulation and digital-to-analog conversion, and to a system for quadrature modulation and digital-to-analog conversion.

More specifically, the invention relates to an entirely new type of transmitter architecture for the transmission of information-carrying signals based on a digital-to-analog conversion directly on an intermediate frequency. Compared to conventional solutions, the invention will mean considerable simplification of the equipment necessary to achieve a transmitter of this type.

The principle is based on quantizing the signal, usually to 1 bit per sample, combined with noise shaping and quadrature modulation with exactly one quarter of the sampling rate used, before the digital-to-analog conversion is carried out at a very high frequency. After analog filtering, a ready modulated signal on a fixed intermediate frequency will be obtained, which subsequently may be very easily mixed down to the desired frequency, if necessary. This requires that the sampling rate used is at least as high as four times the desired frequency.

DESCRIPTION OF THE RELATE ART

In conventional analog transmitter architectures it is usual to use three steps to modulate a signal to a desired frequency. Once the signal has first been quadrature modulated to a low intermediate frequency, it is mixed up to a high intermediate frequency, before it is finally mixed down to the desired frequency.

One of the conventional methods for carrying out digital-to-analog (and analog-to-digital) conversion of a low-pass limited signal (e.g., an audiosignal) is to use $\Sigma\Delta$modulation of the signal so that it is represented by 1 bit per sample, at the same time as the introduced quantization noise is shaped spectrally so that most of this noise ends up outside the frequency band of interest. To achieve this noise shaping to a sufficient degree, oversampling is used; i.e., a higher sampling rate than is strictly necessary according to Nyquist. One of the major advantages of this technique is that 1 bit sample values can be very easily and accurately converted from digital to analog form (or vice versa).

It is also known that an already oversampled signal can be interpolated very easily by a simple repetition of sample values, without this impairing the signal to any significant degree. Note, however, that although due to the oversampling the pass band is almost unaffected by the error made, the repeated spectra may contain more energy than desired.

Furthermore, it is common to use two multipliers for performing digital quadrature modulation of a complex baseband signal to a carrier frequency—one multiplier for the in-phase signal (I) and one for the quadrature-phase signal (Q). In the particular instance of the sampling rate used being exactly four times (optionally twice) the desired carrier frequency, all the samples of the carrier frequency signal will have the values 1, −1 or 0, which means that the multipliers can be replaced by simple logic. This is also used in known technology.

SUMMARY OF THE INVENTION

It is an objective of the present invention to simplify substantially the equipment necessary to obtain a digital quadrature modulator and digital-to-analog converter. This is accomplished by a method of the type mentioned above, the characteristic features of which are set forth in claim 1, and by means of a system of the type introduced above, the characteristic features of which are set forth in claim 3. Additional features of the invention are set forth in the other dependent claims.

The proposed solution is based on performing digital-to-analog conversion of a digitally modulated signal at a very high carrier frequency which is equal to exactly one quarter of the sampling rate through the digital-to-analog converter, optionally succeeded by an analog frequency conversion to the desired frequency if this is different from the digitally represented carrier frequency.

The invention provides a method for quadrature modulation of a complex baseband signal represented in digital form to an analog carrier frequency which is directly linked to the sampling rate. This signal can, if so desired, be further converted to another (usually lower) carrier frequency by known analog techniques. It is immaterial for the invention whether the complex baseband signal contains analog or digital information. An appropriately oversampled version of the accurately represented input signal, which is a complex baseband signal represented by the signal components I and Q, is quantized, usually to 1 bit per sample, using one of the known per se methods for shaping the quantization noise, e.g., $\Sigma\Delta$ modulation. The degree of necessary oversampling is determined primarily by the particular order of the noise shaping which is used, in conjunction with the requirements with respect to noise characteristics in the system concerned.

Since the input signal has already been oversampled to a considerable degree, the sampling rate for the quantized versions of the signal components I and Q may, if desired, be further increased by a simple repetition of samples. Due to the oversampling, this simple manner of increasing the sampling rate further will have a minimum effect on the signal band—at the same time as the repeated spectra will also be attenuated. If, however, the requirements are more stringent, the errors may easily be corrected.

The final version of the baseband signal thus consists of two streams of quantized (typically 1 bit) sample values, where the sampling rate is many times greater than twice the highest frequency which occurs in the signal. When this baseband signal is quadrature modulated, a carrier frequency is used which is equal to exactly one quarter of this sampling rate. If an amplitude equal to 1 is selected for the carrier frequency signal, it can be represented by the values 1, −1 and 0, so that all multiplications are replaced by simple logical operations.

But even more important is the fact that the quadrature modulated signal does not now require any increase in the number of bits per sample. Thus, the quadrature modulated signal is represented by the same number (e.g., 1) of bits per sample without any form of further error or noise being introduced by the quadrature modulator. It should also be mentioned that in the quadrature modulation, every second sample of I and every second sample of Q is to be multiplied by 0. This means that the signal components I and Q do not need to be interpolated to 4 times the desired carrier frequency, but only to twice this frequency, and I and Q will each only have to be represented by a sampling rate which is half the rate used for representing the quadrature modulated signal.

Finally, the quadrature modulated signal is transmitted through a digital-to-analog converter followed by a bandpass filter. It is important that this filter suppresses to a significant degree all signals outside the frequency band of the working signal, because the noise shaping process introduces a great deal of noise in these ranges. In addition, this filter will reduce the remains of any repeated spectra to a very low level.

BRIEF DESCRIPTION OF THE DRAWING

The invention will be described in more detail below, with reference to the drawings, wherein:

FIG. 1 shows digital quadrature modulation to a fixed carrier frequency. The operations performed inside the dotted line represent one example of how the total block operation can be performed. Possible alternative realizations of this total block operation must, however, produce exactly the same output signal sequence for a given set of input signal sequences.

FIG. 2 shows a conventional second order $\Sigma\Delta$ modulator.

FIG. 3 shows general noise shaped quantization wherein $G(z)$ determines the noise shaping filter $H(z)=1-z^{-1}G(z)$, where, if $G(z)=2-z^{-1}$, this structure will be equivalent to the conventional second order $\Sigma\Delta$ modulator which is shown in FIG. 2 (with the exception that the delay in the signal path is different).

DESCRIPTION OF THE PREFERRED EMBODIMENTS

The Input Signal

The input signal is a low-pass limited complex baseband signal containing all the information which later is to be modulated onto a fixed intermediate frequency. It is irrelevant what type of information (e.g., analog or digital) is represented by the baseband signal. It is also irrelevant for the invention which type of modulation method is used, and if it is a single or a multi-carrier signal. It may even be a multi-channel signal consisting of a number of individually different channels. In one specific application, the level of the baseband signal can be selected within the range which yields a sufficiently good signal-to-noise ratio in the ready modulated signal.

The complex baseband signal is represented by the two real signal components I and Q corresponding to the two branches in FIG. 1. The highest frequency is normally B/2 where B is the bandwidth of the baseband signal. Each of the signal components I and Q is represented by a sequence of equidistant time samples where the sampling rate is several times higher than the Nyquist rate B. The ratio between the sampling rate used and the Nyquist rate is defined as the oversampling factor. On account of the subsequent signal processing, a sufficient degree of oversampling is required, which is determined by the system requirements in conjunction with the details in the subsequent signal processing.

If, at the outset, the signal components I and Q are not represented by a sufficient degree of oversampling, they must each be interpolated separately to ensure that the sampling rate is sufficiently high before the noise shaped quantizing can be carried out. Conversely, if the input baseband signal is represented by an unnecessarily high degree of oversampling, it may instead first be decimated to the desired sampling rate. Moreover, it must be ensured that the sampling rate of the input signal is an integral factor lower than the desired sampling rate of the quadrature modulated signal which is to be produced. Each signal sample must be represented with sufficient accuracy to ensure that the signal-to-noise ratio in the signal band is better than the application calls for, even at the lowest signal level in question. This is due to the fact that the subsequent signal processing will introduce additional noise.

Quantization Device

The input signal, represented by samples of the signal components I and Q as described above, are quantized to a number (usually 1) of bits per sample, by using one of the known per se methods for shaping the quantization noise, e.g., $\Sigma\Delta$ modulation. This quantization is carried out on the two signals I and Q, separately, in the units marked NSQ (Noise Shaped Quantization) in FIG. 1. Two simple examples of how such noise shaped quantization NSQ can be carried out are shown in FIGS. 2 and 3.

The Quantized Versions of the Signal Components I and Q

Figure 4:
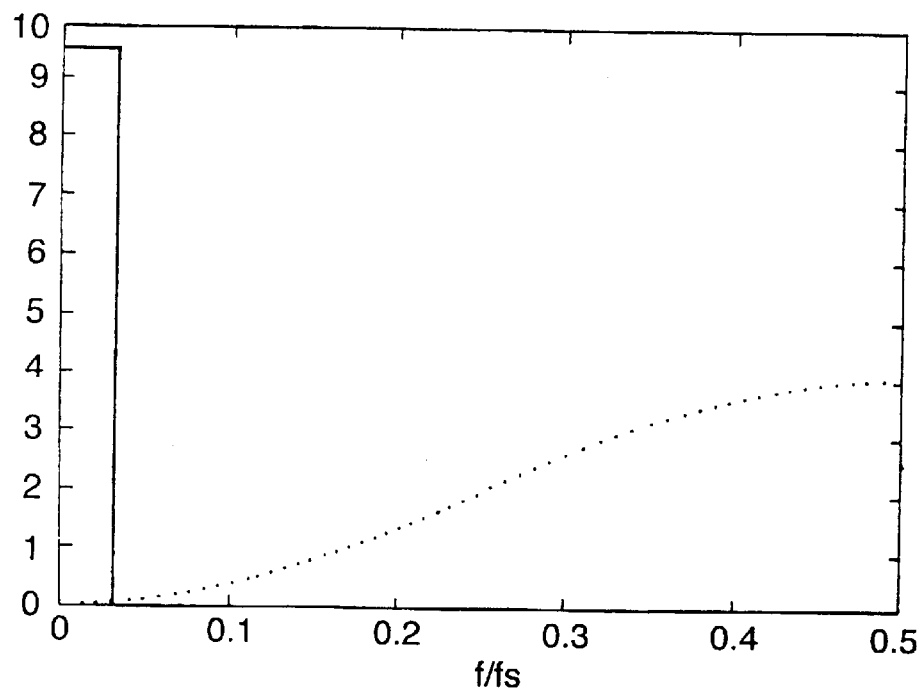
FIG. 4 shows a typical signal spectrum (the solid line) and noise spectrum (the dotted line) after noise shaped quantization of a low-pass limited signal.

By quantizing the two signal components I and Q (usually to 1 bit per sample), a quantization error will be introduced. This quantization error (or noise) will have a power spectrum that is typically indicated by the dotted line in FIG. 4. The figure illustrates the important fact that when the oversampling factor is sufficiently high, a very small portion of the noise will end up within the signal band, while most of the noise—which ends up outside the signal band—can be removed by subsequent filtering. This filtering is, however, not done until after the digital-to-analog conversion has been carried out.

Simple Rate Conversion Device for Converting the Sampling Rate to Twice the Desired Carrier Frequency The quantized versions of the signal components I and Q should, in principle, each be up-converted separately by a factor M to a sampling rate $f_s$ which is equal to exactly 4 times the desired carrier frequency for the digital quadrature modulation. Due to the already high oversampling factor, this may be done quite accurately by repeating each quantized sample M times in succession. It is still important that I and Q are processed separately.

Since the signal is subsequently to be quadrature modulated by exactly one quarter of this sampling rate, every second sample of I and every second sample of Q will not be used. Hence it is sufficient to repeat each sample of the quantized versions of the signal components I and Q, separately, ½ M times (instead of M times), as is indicated in FIG. 1, and thereby obtain a sampling rate which is only equal to twice the desired carrier frequency. If M is odd, this means that every second sample is repeated ½(M+1) times and every second sample ½(M−1) times.

In fact, the samples of the final versions of the two signal components I and Q should be shifted in time by $T=1/f_s$ relative to one another, but since neighboring samples are identical after the repetition M times described above (M>1), this is of no practical significance. However, it is important to note that even if the sampling rate of the final versions of the signal components I and Q separately is only twice the desired carrier frequency, the equivalent sampling rate $f_s$ is still equal to 4 times the desired carrier frequency, so that every second point of time is represented by an I sample and the remaining every second point of time by a Q sample.

Note that if M=2 a conversion of the sampling rate before quadrature modulation is unnecessary. However, if M=1, the quantized versions of the signal components I and Q must each separately be decimated by 2 (to half the sampling rate). This must be done by having all the original points of time represented, but so that every second point of time is represented by an I sample and the remaining every second point of time by a Q sample.

Figure 5:
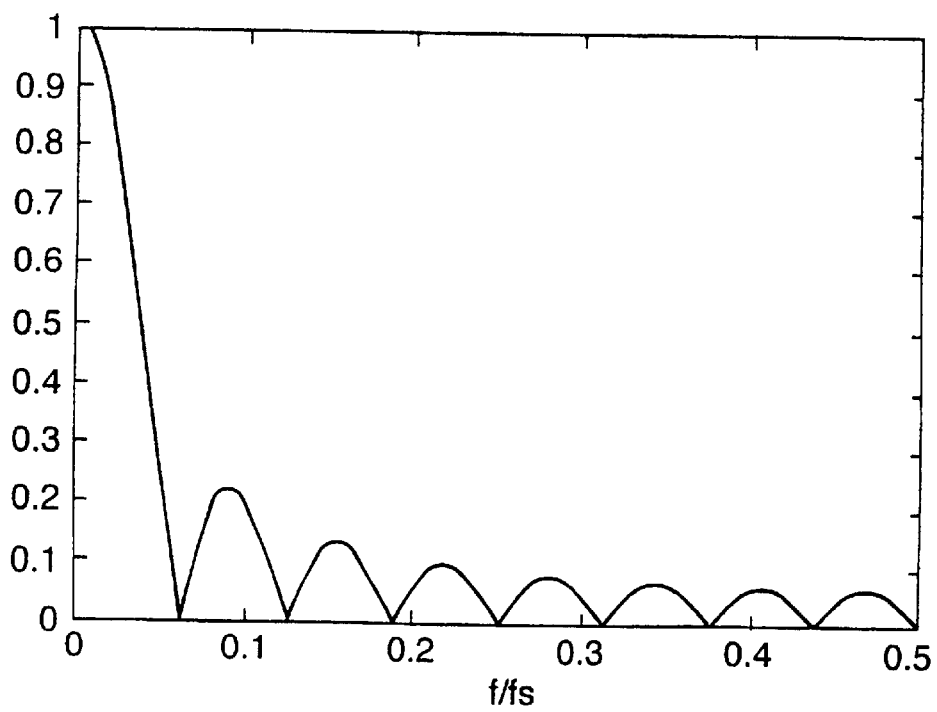
FIG. 5 shows the module of the frequency transmission function for an interpolator which repeats each sample M=16 times.
Figure 6:
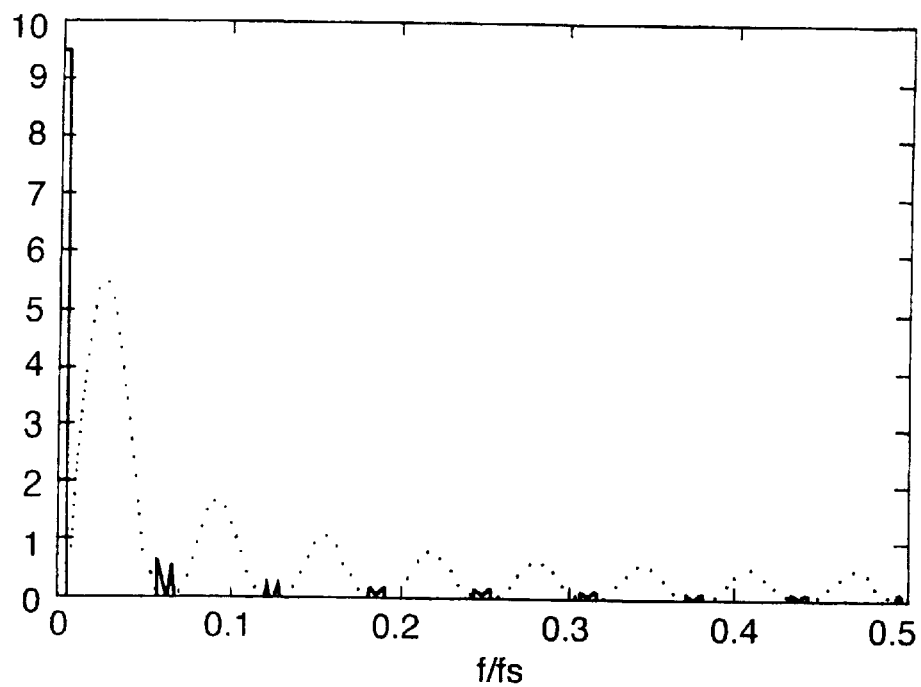
FIG. 6 shows an example (M=16) of a signal spectrum (the solid line) and noise spectrum (the dotted line) for a ready interpolated signal I or Q immediately prior to digital quadrature modulation.

If the equivalent interpolation factor M>1, the simple rate conversion device will in principle perform an up-conversion. The equivalent interpolation filter has the following normalized transmission function, $$H(f) = \frac{\sin(M\pi fT)}{M\sin(\pi fT)} \cdot e^{-j(M-1)\pi fT}$$

where $T=1/f_s$ is the time interval between the samples after each of them has been repeated M times. The time delay of the transmission function is ½(M−1)T, while the module is illustrated in FIG. 5. FIG. 6 shows an example of what the signal spectrum for the ready interpolated signals I and Q may look like.

The Final Versions of the Signal Components I and Q

The final versions of the signal components I and Q will automatically be represented by the number of bits per sample which is determined by the quantization device (usually 1 bit per sample).

If the oversampling factor of the signal components I and Q at the equivalent sampling rate $f_s$ is F, the maximum frequency in the baseband signal will be $f_p = f_s/2F$. For large F, $f_p$ will be so small that the above described H(f will be very close to 1 (i.e., 0 dB) in the entire pass band, whilst the repeated spectra (centered at the frequencies $f_k = kf_s/M$ where k=1,2,K,M−1) will be attenuated.

If the factor M is an even number (and, in fact, the interpolation is performed by the integer factor ½ M), the final version of the signal components I and Q will always contain an undesired attenuated repeated spectrum centered around $f_s/2$. This repeated spectrum, which has band edges at $f_s/2 \pm f_s/2F$, is of particular interest, because it will infiltrate the actual signal band when the digital quadrature modulation described below is carried out. At $f_s/2$ the interpolation filter has infinite attenuation, while the attenuation is least at the band edges of this particular repeated spectrum, where $$|H(f = f_s/2 \pm f_s/2F)| = \frac{\sin(M\pi/2F)}{M\cos(\pi/2F)} \approx \frac{\pi}{2F}.$$

The approximation used in the expression at the far right is very good when F is large, which is the case in the application in question. (Note that even in the case of M=2 and the least conceivable F=2, the error in the approximation is less than 1 dB.) If, e.g., a minimum attenuation of 40 dB of the repeated spectrum centered around $f_s/2$ is required, an oversampling factor F>50π would be required.

If the factor M is an odd number (and, in fact, every second sample is repeated ½(M+1) times and every second sample ½(M−1) times), the final version of the signal components I and Q will not contain a repeated spectrum centered around $f_s/2$. Hence no repeated spectrum of the signal will infiltrate the signal band after quadrature modulation, except if the oversampling factor prior to the last up-conversion is very small. This is, however, not the case in practice. Instead, a repeated spectrum of the substantial quantization noise around $f_s/2$ will infiltrate the signal band, thus destroying the nice noise shaping characteristic obtained by the quantization device.

Digital Quadrature Modulator

When digital quadrature modulation of I and Q is carried out at a quarter of the sampling rate $f_s$, two orthogonal carrier frequency signals are required, both consisting of the sample sequence {1,0,−1,0 repeated over and over again. The digital quadrature modulated signal is (the index n denotes the sample number), or, equivalently, $$y(n) = I(n)\cos\left(\frac{n\pi}{2}\right) - Q(n)\sin\left(\frac{n\pi}{2}\right)$$

or, equivalently $$y(n) = \begin{cases} (-1)^k I(n), & n = 2k \\ (-1)^{k+1} Q(n), & n = 2k+1 \end{cases}$$

where k is an integer. In practice, the digital quadrature modulation can be carried out according to the latter expression by first passing the final versions of the signal components I and Q separately through a modulator, which quite simply inverts every second sample, followed by a multiplexer which retrieves a modulated I-sample and then a modulated Q-sample in alternation. Thus, only every second sample of I and every second sample of Q is in fact used to produce the quadrature modulated signal.

This explains why, in practice, there is no need to repeat each sample more than ½M times in the final interpolation (described above), so that the final versions of I and Q each separately are represented by only half of the sampling rate of the quadrature modulated signal.

Note that the sampled quadrature modulated signal, which is now actually centered around the carrier frequency $f_c = f_s/4$, has an infinite number of copies or repeated spectra which can be found around all odd multiples of this carrier frequency, that is to say, $f_{c,j}=(2j-1)f_s/4$ where j is a positive integer, although in such a way that every second spectrum of this type is mirror-inverted, i.e., for all values of j which are even numbers. It is therefore possible to choose which of these repeated spectra to use, provided there is an awareness of whether or not the spectrum chosen is mirror-inverted. If so, the baseband signal must be mirror-inverted (which can easily be done, e.g., by simply inverting the sign of all Q component samples) as a precompensation prior to the quadrature modulation.

Possible Combination of the Simple Rate Conversion Device with the Digital Quadrature Modulator It is important to note that, particularly with respect to implementation, the simple rate conversion device and the digital quadrature modulator, which are enclosed by a dotted line in FIG. 1, are very closely related to each other. Hence these elements of the invention should be regarded as a unity, performing a total operation on the quantized versions of the I and Q signals which is equivalent to interpolating each of the signal components I and Q by , ½M before the quadrature modulation is performed as described above. Given two sample sequences I and Q from the NSQ outputs, possible alternative realizations of the combined operation must produce exactly the same output sequence for the quadrature modulated signal. But the practical realization may be different.

The above described realization therefore represents just one specific example of how these operations could be combined. One alternative realization is, of course, to repeat each quantized sample of I and Q (separately) M times in succession to obtain a final sampling rate $f_s$ for the I and Q signal separately. Then the I signal samples should be multiplied by the $f_s/4$-frequency sequence {1,0,−1,0,1,0,−1, 0,K and the Q signal samples should be multiplied by the phase shifted $f_s/4$-frequency sequence {0,−1,0,1,0,−1,0,1,K before the two $f_s/4$ modulated sequences are added together. But a number of other alternative realizations are possible. It is, however, irrelevant for this invention which particular realization is used for the combination of the simple rate conversion device and the digital quadrature modulator.

The Quadrature Modulated Signal

Figure 7:
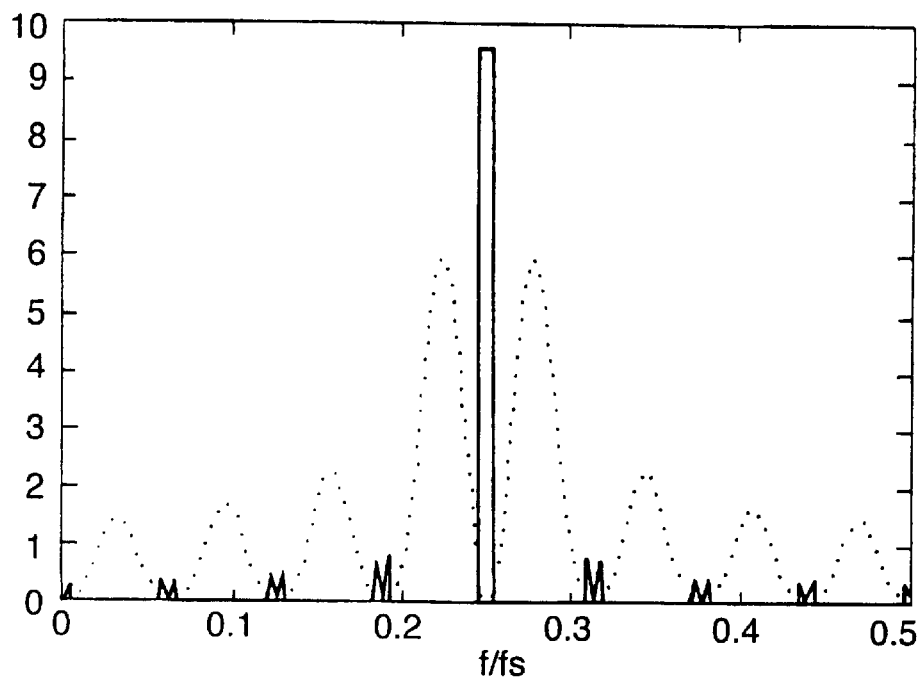
FIG. 7 shows an example (M=16) of a signal spectrum (the solid line) and a noise spectrum (the dotted line) for $f_s/4$ quadrature modulated signal.

The quadrature modulated signal, represented by $f_s$ samples per unit of time, will automatically be represented by the number of bits per sample which has been determined by the quantization device (usually 1 bit per sample). It will have a signal spectrum as illustrated in FIG. 7. As described above, this signal will (for any M>1) contain a small error in the pass band, due to the repeated spectrum centered around $f_s/2$ in the final version of the baseband signal. After quadrature modulation this repeated spectrum will represent a mirror inverted (or image) spectrum in the same frequency band as the desired signal. Even if this image spectrum error is attenuated (see the above description of the final versions of the signal components I and Q), this image spectrum error cannot be neglected when the oversampling factor is small. (E.g., for an oversampling factor of F20 the image spectrum attenuation is only 22 dB at the band edges.)

Note, however, that for any M>1, the quadrature modulator of this invention will in fact delay the sequence of Q sample values by exactly one sample interval $T_s=1/f_s$. This delay represents an error which explains the image spectrum error described above. Fortunately, this error can be canceled out by also delaying the I component by exactly the same delay $T_s$. However, this compensating delay, which must be performed by a high quality delay device, must be introduced to the I component before the quantization device, i.e. directly on the I component input signal sequence. (If the delay were introduced after the quantization device, a second quantizer would have been required for the I component after the delaying device.)

Digital-to-analog Convertor and Bandpass Filter

The quadrature modulated signal, which thus is still represented by a small number (usually 1) of bits per sample, finally passes through a digital-to-analog converter before it is filtered in a bandpass filter. This filter must have sufficient attenuation outside the signal band to ensure that the shaped quantization noise and the rest of the repeated spectra are attenuated to a sufficient degree for the application in question.

What is claimed is:

1. A method of quadrature modulation and digital-to-analog conversion, comprising the steps of:

sampling a digitally represented input complex baseband signal, represented by an in-phase (I) component and a quadrature-phase (Q) component, at a sampling rate to achieve a desired noise shaping;

separately quantizing the in-phase component and the quadrature-phase component to a number of bits per sample to produce quantized versions of the in-phase and quadrature-phase components, the quantizing step introducing quantization noise that is shaped spectrally to have energy falling largely outside the frequency band of the input complex baseband signal;

quadrature modulating the quantized versions of the in-phase and quadrature-phase components to a quadrature modulated signal at a carrier frequency equal to a quadrature modulated signal exactly one quarter of a sampling rate fs to obtain a quadrature modulated signal with repeated spectra of the modulated signal being found around all odd multiples of the carrier frequency;

converting the quadrature modulated signal to an analog form signal through a digital-to-analog converter; and eliminating unwanted energy outside a frequency band used for a target channel by passing the analog form signal through a bandpass filter wherein, said quantizing step uses sigma-delta quantization, and subsequent to said quantizing step and prior to the quadrature modulating step, there is a further step of separately rate-converting the quantized versions of the in-phase and quadrature-phase components by a factor ½M, where M is a selected positive integer, to a sampling rate fs=2fc/(2k−1) by repetition of each quantized sample a total of ½M times if M is an even number greater than 2, by no rate-conversion if M=2, and by omission of an in-phase component sample at every second point of time and omission of a quadrature-phase component at all points of time other than every second point of time if M=1, where k is a selected positive integer and fc is the carrier frequency to which the input complex baseband signal is to be modulated.

2. The method of claim 1, wherein said sampling step is preceded by a step of interpolating the baseband signal to obtain a desired sampling rate.

3. The method of claim 1, wherein said sampling step is preceded by a step of decimating the baseband signal to obtain a desired sampling rate.

4. The method of claim 1, wherein during said quantizing step, the in-phase component is delayed by a time Ts before quantizing the in-phase component to the number of bits per sample.

5. The method of claim 1, wherein during said quantizing step, the in-phase component and the quadrature-phase component are quantized in separate noise shaped quantization units.

6. The method of claim 1, wherein subsequent to said quantizing step and prior to the quadrature modulating step, there is a further step of separately rate-converting the quantized versions of the in-phase and quadrature-phase components to a sampling rate fs=1ts=4fc/(2k−1) where fc is the carrier frequency to which the input complex baseband signal is to be modulated and k is a selected positive integer.

7. The method of claim 1, wherein said step of quadrature modulating the quantized versions of the in-phase and quadrature-phase components to a carrier frequency equal to exactly one quarter of a sampling rate fs to obtain a quadrature modulated signal with repeated spectra of the modulated signal being found around all odd multiples of the carrier frequency, quadrature modulates the quantized versions of the in-phase and quadrature-phase components by inversion of every second quantized sample value of the in-phase component and inversion of every second quantized sample value of the quadrature-phase component and then multiplexing together the in-phase and quadrature-phase components to produce a quadrature modulated signal with a sampling rate twice a sampling rate of the quantized versions of the in-phase and quadrature-phase components and consisting of blocks of 4 samples where each said block comprises a sequence of a form {I(n),–Q(n+1),–I(n+2),Q(n+3)}, the arguments n, n+1, n+2, and n+3 indicating represented points of time.

8. A system for quadrature modulation and digital-to-analog conversion, comprising:

input points of first and second samplers respectively for receiving an in-phase (I) component and a quadrature-phase (Q) component of a baseband signal;

inputs points of first and second quantization units respectively connected to outputs of the first and second samplers, each of the quantization units for separately quantizing the in-phase component and the quadrature-phase component to a number of bits per sample to produce quantized versions of the in-phase and quadrature-phase components, the quantized versions of the in-phase and quadrature-phase components having quantization noise shaped spectrally to have energy falling largely outside the frequency band of the input complex baseband signal;

a modulating device with a modulating device, with modulating channels, comprising an in-phase modulating channel and a quadrature-phase modulating channel, the modulating channels combining at a common output, the modulating channels quadrature modulating the quantized versions of the in-phase and quadrature-phase components to a quadrature modulated signal, appearing at the common output, at a carrier frequency equal to exactly one quarter of a sampling rate fs to obtain a quadrature modulated signal with repeated spectra of the modulated signal being found around all odd multiples of the carrier frequency;

a digital-to-analog converter having an input connected to the common output, the converter converting the quadrature modulated signal and, at a converter output, providing an analog form signal; and a bandpass filter having an input connected to the converter output, the filter to eliminate energy outside a frequency band used by a target channel wherein, said quantization units are sigma-delta quantization units, and said system further includes separate rate converting units for separately rate-converting the quantized versions of the in-phase and quadrature-phase components by a factor ½M, where M is a selected positive integer, to a sampling rate fs=2/(2K–1) by repetition of each quantized sample a total of ½M times if M is an even number greater than 2, by no rate- conversion if M=2, and by omission of an in-phase component sample at every second point of time and omission of a quadrature-phase component at all points of time other than every second point of time if M=1, where k is a selected positive integer and fc is the carrier frequency to which the input complex baseband signal is to be modulated.

9. The system of claim 8, wherein said first and second samplers each comprise an interpolator.

10. The system of claim 8, wherein said first and second samplers each comprise a decimator.

11. The system of claim 8, wherein said first quantization unit comprises a delay unit to delay the in-phase component by a time Ts before quantizing the in-phase component to the number of bits per sample.

12. The system of claim 8, wherein said quantization units are noise shaped quantization units.

13. The system of claim 8, wherein said modulating device comprises separate units separately rate-converting the quantized versions of the in-phase and quadrature-phase components to a sampling rate fs=1ts=4fc/(2k–1) where fc is the carrier frequency to which the input complex baseband signal is to be modulated and k is a selected positive integer.

14. The system of claim 8, where in said modulating device quadrature modulates the quantized versions of the in-phase and quadrature-phase components to a carrier frequency equal to exactly one quarter of a sampling rate fs to obtain a quadrature modulated signal with repeated spectra of the modulated signal being found around all odd multiples of the carrier frequency, quadrature modulates the quantized versions of the in-phase and quadrature-phase components by inversion of every second quantized sample value of the in-phase component and inversion of every second quantized sample value of the quadrature-phase component and then multiplexing together the in-phase and quadrature-phase components to produce a quadrature modulated signal with a sampling rate twice a sampling rate of the quantized versions of the in-phase and quadrature-phase components and consisting of blocks of 4 samples where each said block comprises a sequence of a form {I(n),–Q(n+1),–I(n+2),Q(n+3)}, the arguments n, n+1, n+2, and n+3 indicating represented points of time.

15. A system for quadrature modulation and digital-to-analog conversion, comprising:

input points of first and second sampling means respectively for receiving an in-phase (I) component and a quadrature-phase (Q) component of a baseband signal;

first and second quantization means connected to outputs of the first and second sampling means, each of the quantization means for separately quantizing the in-phase component and the quadrature-phase component to a number of bits per sample to produce quantized versions of the in-phase and quadrature-phase components, the quantized versions of the in-phase and quadrature-phase components having quantization noise shaped spectrally to have energy falling largely outside the frequency band of the input complex baseband signal;

a modulating means comprising an in-phase modulating channel means and a quadrature-phase modulating channel means, the modulating channel means combining at a common output, the modulating channel means for quadrature modulating the quantized versions of the in-phase and quadrature-phase components to a quadrature modulated signal, appearing at the common output, at a carrier frequency equal to exactly one quarter of a sampling rate fs to obtain a quadrature modulated signal with repeated spectra of the modulated signal being found around all odd multiples of the carrier frequency;

a digital-to-analog converter having an input connected to the common output, the converter converting the quadrature modulated signal and, at a converter output, providing an analog form signal; and a bandpass filter means having an input connected to the converter output, the filter means for eliminating energy outside a frequency band used by a target channel wherein, said quantization means are sigma-delta quantization units, and said system further includes separate rate converting units for separately rate-converting the quantized versions of the in-phase and quadrature-phase components by a factor ½M, where M is a selected positive integer, to a sampling rate fs=2fc/(2k−1) by repetition of each quantized sample a total of ½M times if M is an even number greater than 2, by no rate-conversion if M=2, and by omission of an in-phase component sample at every second point of time and omission of a quadrature-phase component at all points of time other than every second point of time if M=1, where k is a selected positive integer and fc is the carrier frequency to which the input complex baseband signal is to be modulated.

16. The system of claims 15, wherein said modulating means comprises separate means for separately rate-converting the quantized versions of the in-phase and quadrature-phase components to a sampling rate fs=1ts=4fc/(2k−1) where fc is the carrier frequency to which the input complex baseband signal is to be modulated and k is a selected positive integer.

17. The system of claim 15, wherein said modulating means quadrature modulates the quantized versions of the in-phase and quadrature-phase components to a carrier frequency equal to exactly one quarter of a sampling rate fs to obtain a quadrature modulated signal with repeated spectra of the modulated signal being found around all odd multiples of the carrier frequency, quadrature modulates the quantized versions of the in-phase and quadrature-phase components by inversion of every second quantized sample value of the in-phase component and inversion of every second quantized sample value of the quadrature-phase component and then multiplexing together the in-phase and quadrature-phase components to produce a quadrature modulated signal with a sampling rate twice a sampling rate of the quantized versions of the in-phase and quadrature-phase components and consisting of blocks of 4 samples where each said block comprises a sequence of a form {I(n),−Q(n+1),−I(n+2),Q(n+3)}, the arguments n, n+1, n+2, and n+3 indicating represented points of time.

\* \* \* \* \*